(12) United States Patent
Yerly et al.

(10) Patent No.: US 12,381,385 B2
(45) Date of Patent: Aug. 5, 2025

(54) ACTIVE PRE-LOAD RESISTOR

(71) Applicant: ABB Schweiz AG, Baden (CH)

(72) Inventors: Paul Thomas Yerly, Richmond, VA (US); Thomas Anthony Kendzia, III, Richmond, VA (US); Christopher Alan Belcastro, Richmond, VA (US); Veerakumar Bose, Richmond, VA (US)

(73) Assignee: ABB SCHWEIZ AG, Baden (CH)

( * ) Notice: Subject to any disclaimer, the term of this patent is extended or adjusted under 35 U.S.C. 154(b) by 0 days.

(21) Appl. No.: 18/506,795

(22) Filed: Nov. 10, 2023

(65) Prior Publication Data

US 2025/0158389 A1 May 15, 2025

(51) Int. Cl.
*H02J 9/06* (2006.01)
*H02H 7/22* (2006.01)
*H02J 3/12* (2006.01)

(52) U.S. Cl.
CPC ............... *H02H 7/222* (2013.01); *H02J 3/12* (2013.01)

(58) Field of Classification Search
CPC ...................................................... H02H 7/222
See application file for complete search history.

(56) References Cited

U.S. PATENT DOCUMENTS

| | | | |
|---|---|---|---|
| 7,737,579 B1 * | 6/2010 | Czarnecki | H01H 9/26 307/64 |
| 10,033,220 B1 * | 7/2018 | Nguyen | H02J 9/06 |
| 10,291,028 B2 * | 5/2019 | Novak | H02J 3/0012 |
| 2024/0369647 A1 * | 11/2024 | Shah | G01R 31/68 |

* cited by examiner

*Primary Examiner* — Jared Fureman
*Assistant Examiner* — Esayas G Yeshaw
(74) *Attorney, Agent, or Firm* — Greenberg Traurig, LLP (57) ABSTRACT

Systems and methods for a transfer switch including a first switch device at a first leg between a first power source and an electrical load, and a second switch device at a second leg between a second power source and the electrical load and a first resistor circuit including a third switch device connected to the first leg. The third switch device switches between open and closed states in response to the state of the first switch device to limit back feed voltage generated as a result of leakage current when the first power source is inactive. The system may also include a second resistor circuit including a fourth switch device connected to the second leg. The fourth switch device switches between open and closed states in response to the state of the second switch device to limit back feed voltage as a result of leakage current when the second power source is inactive.

20 Claims, 5 Drawing Sheets

FIG. 5

ACTIVE PRE-LOAD RESISTOR

FIELD

The present disclosure relates to the field of transfer switches. More particularly, to active pre-load resistors for reducing leakage current.

BACKGROUND

Transfer switches can include one or more switch devices. The switch devices can be a solid-state switch device including therein a structure that can cause leakage current to build up at the transfer switch when the switch device is in the closed state (e.g., switched off). Typically, in the transfer switch, one switch device is in the closed state connecting an electrical power source to an electrical load while another switch device is in the open state and the other electrical power source is unavailable to the electrical load. A back-feed voltage can develop at the switch device input terminal due to leakage current. This back-feed voltage can build up large enough to become an electric shock hazard that interferes with the switching operation of the transfer switch and/or damage the switch device in the transfer switch.

SUMMARY

Pre-load resistors are a safety feature in electrical devices that may be connected to the device to snub back-fed voltages. Typically, conventional pre-load resistors known in the prior art are hard-wired to the electrical device such as, for example, a transfer switch. As a result of being hard-wired to the transfer switch, the pre-load resistors continue to dissipate power when the solid-state switch device connects the corresponding electrical power source to the electrical load. Although conventional hardwired pre-load resistors protect against back-feed voltage build up at the switch device in both active and inactive source conditions (e.g., switch device is open or closed to connect/disconnect the electrical source to the load), they also reduce system efficiency due to losses from dissipating power when the switch device is in the closed state and connecting the electrical power source to the electrical load. Although the loss across these pre-load resistors is negligible during inactive source states (e.g., power source disconnected by switch device), the loss across these conventional pre-load resistors during normal connected operation may be approximately 100× larger than in inactive source condition. Moreover, systems including a plurality of transfer switches (e.g., facilities having many transfer switches installed therein) connected to one or more electrical loads, these systems may be sensitive to the amount of ground current in the system.

Due to being hardwired to the transfer switch, conventional pre-load resistors are rated (e.g., and sized) to withstand a maximum voltage/current rating for when the switch device is in the closed state and connects the electrical power source and the electrical load. Accordingly, conventional pre-load resistors utilize a large amount of space to accommodate the larger components necessary to withstand the high voltage/current when the electrical power source is connected to the electrical load by the terminal switch device.

Various embodiments of the present disclosure relate to systems, devices, and/or methods that relate to an active pre-load resistor circuit including an active switch device that selectively connects the pre-load resistor circuit to a transfer switch based on an open state or closed state of a switch device located at a terminal of the transfer switch. The switch device in the transfer switch electrically connects an electrical power source with an electrical load. As such, when the switch device in the transfer switch switches to the open position, e.g., disconnecting the electrical power source from the electrical load, the active switch switches to a closed position, thereby connecting the pre-load resistor circuit to the transfer switch. The active pre-load resistor circuit addresses the phenomenon of leakage current in the thyristor or solid state switching device in the transfer switch by providing a discharge path to ground, thereby shunting the leakage current down to a safe level in the transfer switch.

A method for providing the active pre-load resistor to the transfer switch is implemented for selectively connecting the pre-load resistor circuit to the transfer switch based on the state (e.g., open state or closed state) of the switch device at the transfer switch. The active control scheme, based on the state of the transfer switch, controls a switching operation of the switch device to connect the pre-load resistor circuit to the transfer switch when the corresponding switch device in the transfer switch is in an open state, such that the pre-load resistor(s) in the resistor circuit may be used to snub the back-feed voltage that may build up at the inactive source terminal, which can damage the switch devices of the transfer switch or interfere with the control of the system.

The various embodiments of the present disclosure reduce the relative size of the pre-load resistor circuit compared to conventional passive pre-load resistors. The active pre-load resistor being able to provide leakage current protection when the corresponding switching device in the transfer switch is in the open state enables the active pre-load resistor circuit to operate at a lower wattage, thereby enabling the components of the pre-load resistor circuit to have a lower rating and smaller size compared to conventional passive pre-load resistors that have higher ratings and larger sizes due to always remaining connected to the transfer switch. As such, the components of the active pre-load resistor may be arranged on a printed circuit board, thereby reducing the overall dimensions of the active pre-load resistor circuit compared to conventional pre-load resistors. In addition, by controlling when the active preload resistor circuit connects to the transfer switch, this active scheme allows for improved efficiency at the transfer switch by not dissipating power when the switch device in the transfer switch is in the closed state, along with providing the ability to tune the amount of leakage current in the system.

In some embodiments, a system includes a transfer switch including a first switch device located at a first leg between a first power source and an electrical load, and a second switch device located at a second leg between a second power source and the electrical load. The system includes a first resistor circuit connected to the first leg and including a third switch device, the third switch device switches to an open state to disconnect the first resistor circuit from the transfer switch based on the first switch device being in a close state, and the third switch device switches to a close state to connect the first resistor circuit to the transfer switch in response to the first switch device being in an open state. The first resistor circuit limits back feed voltage generated as a result of leakage current in the transfer switch when connected to the transfer switch.

In some embodiments, the system further includes a second resistor circuit connected to the second leg and including a fourth switch device, the fourth switch device switches to an open state to disconnect the second resistor circuit from the transfer switch based on the second switch device being in a close state, and the fourth switch device switches to the close state to connect the second resistor circuit to the transfer switch in response to the second switch device being in an open state. The second resistor circuit limits back feed voltage generated as a result of leakage ground current in the transfer switch.

In some embodiments, the first resistor circuit or the second resistor circuit limits back feed voltage in the transfer switch below a threshold limit, the back feed voltage builds up due to ground leakage current.

In some embodiments, disconnecting the first resistor circuit when the first switch device is closed or disconnecting the second resistor circuit when the second switch device is closed improves efficiency at the transfer switch by approximately 0.3% at low load levels.

In some embodiments, disconnecting the first resistor circuit or the second resistor circuit improves efficiency of the transfer switch by a range from 0.1 to 0.3% at low load levels.

In some embodiments, the first switch device and the second switch device include a solid state switch device, the third switch device and the fourth switch device include a solid state switch device.

In some embodiments, the third switch device and the fourth switch device may further be selectively controlled to connect the first resistor circuit or the second resistor circuit, respectively, to tune an amount of back feed voltage in the transfer switch.

In some embodiments, each of the third switch device and fourth switch device further includes a controller, the controller detects a position of the first switch device or second switch device, respectively, and controls the third switch device or fourth switch device to switch between the open state and the close state.

In some embodiments, the controller obtains an electrical signal from one or more switch contacts in the first switch device or second switch device, respectively, indicative of the position of the first switch device or second switch device.

In some embodiments, the controller detects a presence of a line voltage at the first leg or second leg, respectively, indicative of the position of the first switch device or the second switch device.

In some embodiments, a transfer switch device includes a first leg including a first switch device located between a first power source and an electrical load, a second leg including a second switch device located between a second power source and the electrical load, a first resistor circuit including a third switch device, the first resistor circuit connecting to the first leg between the first switch device and the first power source, the third switch device switching to an open state to disconnect the first resistor circuit from the transfer switch device based on the first switch device being in a close state, and the third switch device switching to a close state to connect the first resistor circuit to the transfer switch device in response to the first switch device being in an open state, and a second resistor circuit including a fourth switch device, the second resistor circuit connecting to the second leg between the second switch device and the second power source, the fourth switch device switching to an open state to disconnect the second resistor circuit from the transfer switch device based on the second switch device being in a close state, and the fourth switch device switching to the close state to connect the second resistor circuit to the transfer switch device in response to the second switch device being in an open state, the first resistor circuit and second resistor circuit limits back feed voltage due to leakage ground current in the transfer switch device when connected to the transfer switch device.

In some embodiments, the first resistor circuit or the second resistor circuit limits back feed voltage in the transfer switch device below a threshold limit, the back feed voltage builds up due to ground leakage current.

In some embodiments, disconnecting the first resistor circuit or the second resistor circuit improves efficiency of the transfer switch device by a range from 0.1 to 0.3% at low load levels.

In some embodiments, the first switch device and the second switch device include a solid state switch device, and the third switch device and the fourth switch device include a solid state switch device.

In some embodiments, the third switch device and the fourth switch device may further be selectively controlled to selectively connect the first resistor circuit or the second resistor circuit, respectively, to tune an amount of back feed voltage in the transfer switch device.

In some embodiments, each of the third switch device and the fourth switch device further includes a controller, the controller detects a position of the first switch device or second switch device, respectively, and controls the third switch device or fourth switch device to switch between the open state and the close state.

In some embodiments, the controller obtains an electrical signal from one or more switch contacts in the first switch device or second switch device, respectively, indicative of the position of the first switch device or second switch device.

In some embodiments, a method for limiting a back feed voltage generated as a result of leakage current in a transfer switch including obtaining, by a controller, one or more electrical signals indicative of a position of a first switch device and a second switch device in the transfer switch, the first switch device connects a first electrical power source to an electrical load and the second switch device connects a second electrical power source to the electrical load, based on a position of the first switch device, switching, by the controller, a position of a third switch device between an open state and a closed state to connect or disconnect a first resistor circuit to the transfer switch, based on a position of the second switch device, switching, by the controller, a position of a fourth switch device between an open state and a closed state to connect or disconnect a second resistor circuit to the transfer switch, and connecting the first resistor circuit or the second resistor circuit when a respective one of the first switch device or second switch device is in the open state limits the back feed voltage in the transfer switch, disconnecting the first resistor circuit or the second resistor circuit when the respective one of the first switch device or second switch device is in the closed state improves efficiency of the transfer switch by approximately 0.3% at low load level.

In some embodiments, switching the position of the third switch device between open and closed states to connect or disconnect the first resistor circuit to the transfer switch further includes in response to determining the first switch device is in the open state, switching, by a first controller, the third switch device to the closed state to connect the first resistor circuit to the transfer switch, and in response to determining the first switch device is in the closed state, switching, by the first controller, the third switch device to the open state to disconnect the first resistor circuit from the transfer switch.

In some embodiments, switching the position of the fourth switch device between open and closed states to connect or disconnect the second resistor circuit to the transfer switch further includes in response to determining the second switch device is in the open state, switching, by a second controller, the fourth switch device to the closed state to connect the second resistor circuit to the transfer switch to limit back feed voltage generated as a result of leakage ground current in the transfer switch, and in response to determining the second switch device is in the closed state, switching, by the second controller, the fourth switch device to the open state to disconnect the second resistor circuit from the transfer switch.

BRIEF DESCRIPTION OF THE DRAWINGS

Some embodiments of the disclosure are herein described, by way of example only, with reference to the accompanying drawings. With specific reference now to the drawings in detail, it is stressed that the embodiments shown are by way of example and for purposes of illustrative discussion of embodiments of the disclosure. In this regard, the description taken with the drawings makes apparent to those skilled in the art how embodiments of the disclosure may be practiced.

DETAILED DESCRIPTION

Among those benefits and improvements that have been disclosed, other objects and advantages of this disclosure will become apparent from the following description taken in conjunction with the accompanying figures. Detailed embodiments of the present disclosure are disclosed herein; however, it is to be understood that the disclosed embodiments are merely illustrative of the disclosure that may be embodied in various forms. In addition, each of the examples given regarding the various embodiments of the disclosure which are intended to be illustrative, and not restrictive.

Figure 1:
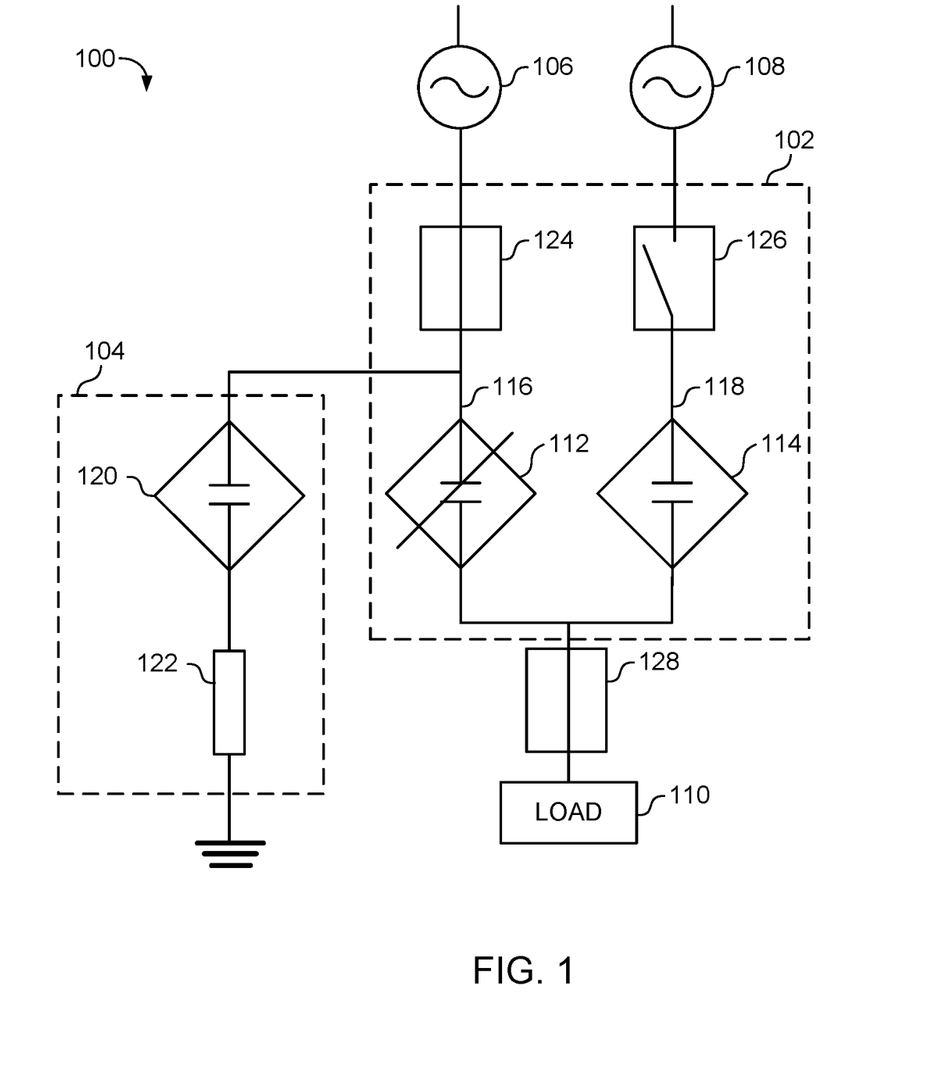
FIG. 1 is a schematic diagram illustrating a system, according to some embodiments.

FIG. 1 is a schematic diagram illustrating a system 100, according to some embodiments.

The system 100 includes a transfer switch 102 and a pre-load resistor circuit 104. Transfer switch 102 may also be referred to as a static transfer switch. Transfer switch 102 connects one of power source 106 and power source 108 to an electrical load 110 by selectively controlling a switching operation of one or more switch devices, as will be further described herein. In some embodiments, transfer switch 102 may include therein pre-load resistor circuit 104. In other embodiments, transfer switch 102 may include therein one or more pre-load resistor circuit 104, as will be further described herein. In some embodiments, power source 106, power source 108, and electrical load 110 may be external relative to system 100 and connected to the transfer switch 102. In other embodiments, system 100 may further include power source 106, power source 108, and electrical load 110 therein. In some embodiments, the system 100 may include a plurality of transfer switch 102 and pre-load resistor circuit 104 connecting a plurality of electrical power sources, such as power source 106 and power source 108, to one or more electrical loads, such as electrical load 110.

Transfer switch 102 includes switch device 112 and switch device 114. Switch device 112 is located at a leg 116 and connects power source 106 to electrical load 110. Switch device 112 is connected at or adjacent to a terminal of transfer switch 102 that is connected to power source 106. Switch device 114 is located at a leg 118 and connects power source 108 to electrical load 110. Switch device 114 is connected at or adjacent another terminal of transfer switch 102 that is connected to power source 108. Switch device 112 and switch device 114 may be solid-state switching devices that switch between open and closed states to connect power source 106 and power source 108, respectively, to the electrical load 110.

The transfer switch 102 electrically connects one of power source 106 and power source 108 to electrical load 110 by switching a corresponding one of switch device 112 and switch device 114 to the closed state and isolating the other of power source 106 and power source 108 by switching the other one of switch device 112 and switch device 114 to the open state. In this regard, the transfer switch 102 is configured to maintain one of power source 106 and power source 108 in electrical connection with the electrical load 110. Referring to FIG. 1, switch device 112 is in the closed state at leg 116 such that power source 106 is provided electrical power to electrical load 110 and switch device 114 is in the open state at leg 118 such that power source 108 is disconnected from electrical load 110. In some embodiments, the switch device 112 and switch device 114 may both be in the open state such that both power source 106 and power source 108 are not connected to the electrical load 110. For example, both power source 106 and power source 108 may not be connected to electrical load 110 if there is a fault at a common point in the transfer switch 102 which affects both power source 106 and power source 108 from providing power to electrical load 110.

The pre-load resistor circuit 104 includes a switch device 120 and a pre-load resistor 122. The switch device 120 is located between pre-load resistor 122 and transfer switch 102. In addition, pre-load resistor circuit 104 is further connected to ground such that the pre-load resistor circuit 104 and pre-load resistor 122 serve as a shunt resistor to provide a low-resistance path for electrical current when the power source 106 is in an open state. As shown in the example embodiment of FIG. 1, the pre-load resistor circuit 104 is connected to the leg 116 of transfer switch 102 between switch device 112 and power source 106.

Moreover, as shown in FIG. 1, switch device 112 is in the closed position and switch device 120 is in the open position as a result of switch device 112 being in the closed position. The pre-load resistor circuit 104 being electrically disconnected from the transfer switch 102 and the leg 116 when the power source 106 is providing electrical power to the electrical load 110 in normal operation improves efficiency by approximately 0.3% at low load levels. In some embodiments, the pre-load resistor circuit 104 being electrically disconnected from transfer switch 102 and leg 116 when power source 106 is providing electrical power to electrical load 110 in normal operation improves the efficiency by a range of 0.1 to 0.3% at low load levels. By controlling when the pre-load resistor circuit 104 is connected to transfer switch 102, the active scheme allows for efficiency improvements at transfer switch 102, as well as the ability to tune the amount of back feed voltage from leakage current is in the system 100. Furthermore, in facilities that are sensitive to leakage current, the active pre-load resistor scheme described herein enables limiting the amount of back feed voltage from leakage ground current contributed by the transfer switch 102.

In some embodiments, the transfer switch 102 may further include circuit breaker 124 and circuit breaker 126. Circuit breaker 124 is located at the leg 116 between power source 106 and switch device 112. Circuit breaker 126 is located at the leg 118 between power source 108 and switch device 114. The circuit breaker 124 and circuit breaker 126 switch between an open and closed state to electrically connect and disconnect the power source 106 and power source 108, respectively, to electrical load 110 at transfer switch 102. In some embodiments, the circuit breaker 124 and circuit breaker 126 may be automatic switching devices, which may be controlled by a control device to switch between the open and closed state. For example, each of the circuit breaker 124 and circuit breaker 126 may include therein the control device. In another example, an external control device may control the switching operation of circuit breaker 124 and circuit breaker 126 through one or more electrical control signals. In other embodiments, the circuit breaker 124 and circuit breaker 126 may be manually operated circuit breakers configured to be manually operated by a user to switch between the open and closed states. In some embodiments, the system 100 may further include circuit breaker 128. Circuit breaker 128 is located between transfer switch 102 and electrical load 110, to provide electrical isolation capabilities between transfer switch 102 and electrical load 110 in case of a fault at transfer switch 102 or at power source 106 and/or power source 108.

In various embodiments, the system 100 may include one or more active pre-load resistor circuits such as, for example, pre-load resistor circuit 104. In addition, the pre-load resistor circuits may include any of a plurality of configurations including, but not limited to: 1φ 2W+G, 1P transfer switch (resistors connected L-N); 1φ 3W+G, 2P transfer switch (resistors connected L-N); 3φ 3W+G, 3P transfer switch (resistors connected L-G); 3φ 4 W+G, 3P transfer switch (resistors connected L-N); 3φ 4 W+G, 4P transfer switch (resistors connected L-N & N-G, or L/N-G); other configurations; or any combinations thereof. In some embodiments, pre-load resistor circuit may include 1φ 2 W+G, 1P transfer switch (resistors connected L-N). In some embodiments, pre-load resistor circuit may include 1φ 3 W+G, 2P transfer switch (resistors connected L-N). In some embodiments, pre-load resistor circuit may include 3φ 3 W+G, 3P transfer switch (resistors connected L-G). In some embodiments, pre-load resistor circuit may include 3φ 4 W+G, 3P transfer switch (resistors connected L-N). In some embodiments, pre-load resistor circuit may include 3φ 4 W+G, 4P transfer switch (resistors connected L-N & N-G, or L/N-G).

It is to be appreciated by those having ordinary skill in the art that the configuration of transfer switch 102 and the number of components therein is not intended to be limiting. As such, transfer switch 102 may include therein one or more additional components including, but not limited to, switch devices, circuit breakers, sensors, controllers, and the like, in accordance with the present disclosure. It is to be appreciated by those having ordinary skill in the art that the number of electrical power sources and/or the number of electrical loads connected to transfer switch 102 is not intended to be limiting, and that transfer switch 102 may include more or less legs for connecting to the power sources and the electrical loads, in accordance with the present disclosure.

Transfer switch 102 may include one or more solid state switch devices therein. The solid state switch devices therein may include, but is not limited to, SiC metal-oxide-semiconductor field-effect transistors (MOSFETs), insulated gate bipolar transistors (IGBTs), bipolar junction transistors (BJTs), junction-gate field effect transistors (JFETs), silicon controlled rectifiers (SCRs), and SCRs with paralleled resistive turn-off (RTO) circuits, or any combinations thereof, according to various embodiments. The pre-load resistor circuit 104 may also include one or more solid-state switch devices. In some embodiments, the switch device 112 and switch device 114 of transfer switch 102 may each include therein one or more solid state switch devices that may be selectively controlled to place the switch device 112 and switch device 114 in an open state or a closed state. For example, switch device 112 may include therein a plurality of SiC MOSFETS connected in parallel between power source 106 and electrical load 110. In another example, switch device 112 may include therein one or more solid state switch devices located on one or more phases of power source 106 connected to electrical load 110.

The switch device 120 may be a solid state switch device. In some embodiments, the switch device 120 may include therein one or more solid state switch devices that may be selectively controlled to place the switch device 120 in an open state or a closed state. In other embodiments, switch device 120 may be electromechanical switch.

Figure 2:
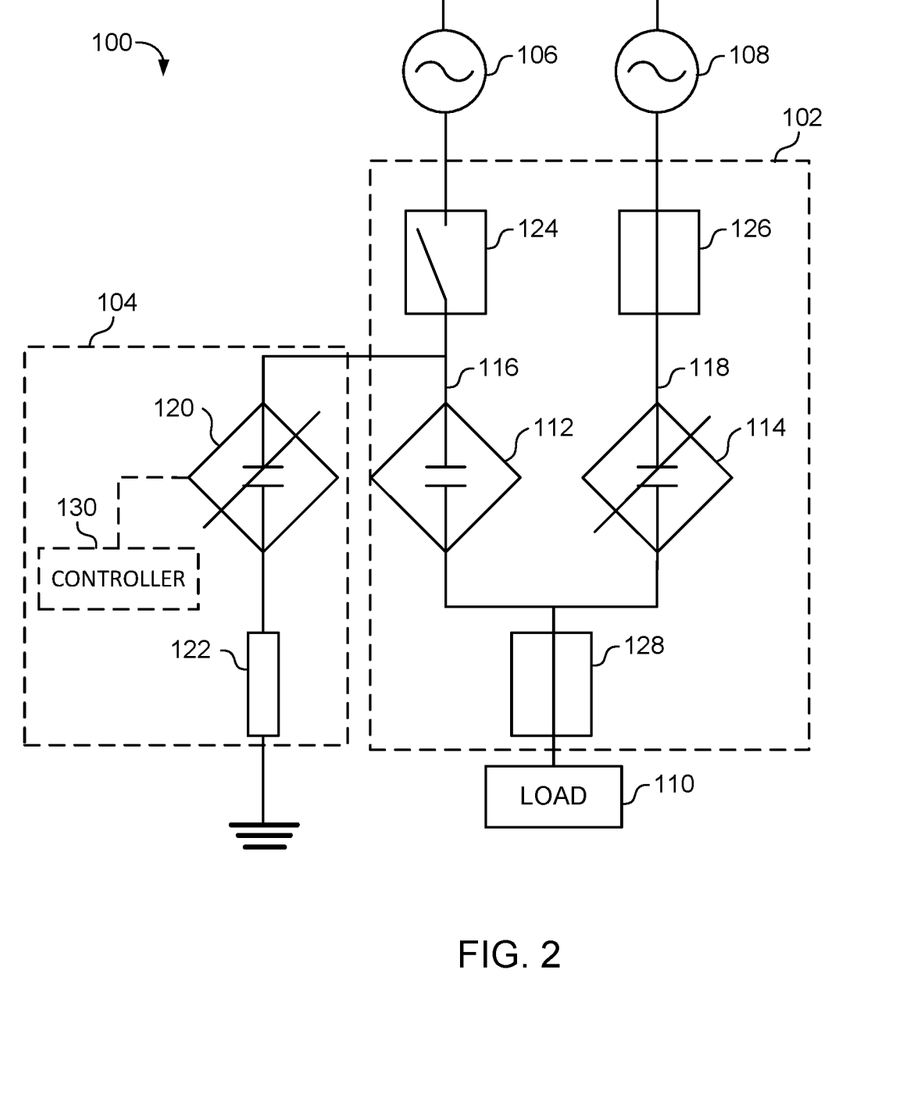
FIG. 2 is a schematic diagram illustrating the system of FIG. 1, according to some embodiments.

FIG. 2 is a schematic diagram illustrating the system 100, according to some embodiments.

In FIG. 2, switch device 112 is in the open state and switch device 114 is in the closed state. As such, power source 106 is electrically disconnected from electrical load 110 and power source 108 is connected to the electrical load 110 to provide electrical power to electrical load 110. In response to switch device 112 being in the open state, switch device 112 is switched to the close state to electrically connect pre-load resistor 122 to transfer switch 102.

The switch device 120 electrically connects pre-load resistor 122 to transfer switch 102 at leg 116 to discharge leakage current that may build up in transfer switch 102 at the leg 116 due to power source 108 conducting to electrical load 110 and power source 106 being disconnected and inactive (e.g., not connected to electrical load 110). The pre-load resistor 122 thereby prevents back-feed voltage from building up at the corresponding terminal of transfer switch 102 due to the leakage current. The pre-load resistor 122 serves as a safety feature for system 100 and transfer switch 102 by reducing the likelihood of the back feed voltage from leakage current building up in the transfer switch 102 to the point that it becomes an electrical shock hazard, which may cause damage to transfer switch 102 or other electrical components such as a main controller for transfer switch 102. In other embodiments, this back-feed voltage that may potentially build up in transfer switch 102 due to leakage ground current without a pre-load resistor circuit such as, for example, pre-load resistor circuit 104 being connected to transfer switch 102 may also interfere with the operation of the main controller controlling an operation of transfer switch 102 and the one or more components therein.

In some embodiments, the transfer switch 102 may further include therein circuit breaker 128 for electrically isolating the transfer switch 102 (and power source 106 and power source 108) from electrical load 110.

In some embodiments, system 100 may further include a controller 130. The controller 130 may include a processor and a memory, the memory being a non-transitory computer readable medium having stored thereon instructions executable by the processor to perform operations including obtaining one or more electrical signals from a sensor and performing one or more operations in response to the one or more electrical signals. In some embodiments, the operations may include obtaining one or more electrical signals indicative of a position of an external switch device and controlling a switching operation of a switch device based on the electrical signals.

In some embodiments, the controller 130 may be in electrical connection with switch device 120 to detect a position of switch device 112 and control a switching operation of switch device 120 based on the electrical signals. In other embodiments, the switch device 120 may include therein controller 130 for detecting a position of switch device 112 and controlling the switching operation of switch device 120 based on the electrical signals.

It is to be appreciated by those having ordinary skill in the art that the number of controllers in system 100 is not intended to be limiting, and system 100 may include one or more controllers therein for controlling an operation of transfer switch 102, pre-load resistor circuit 104, and/or other components of system 100 that may not be included in the present disclosure. For example, in some embodiments, each of switch device 112, switch device 114, and switch device 120 may include therein an individual controller for controlling an operation of the respective switch device. In another example, in other embodiments, the system 100 may include a main controller that controls an operation of switch device 112, switch device 114, switch device 120, circuit breaker 124, circuit breaker 126, circuit breaker 128, other switch devices, or any combinations thereof, in accordance with the present disclosure.

Figure 3:
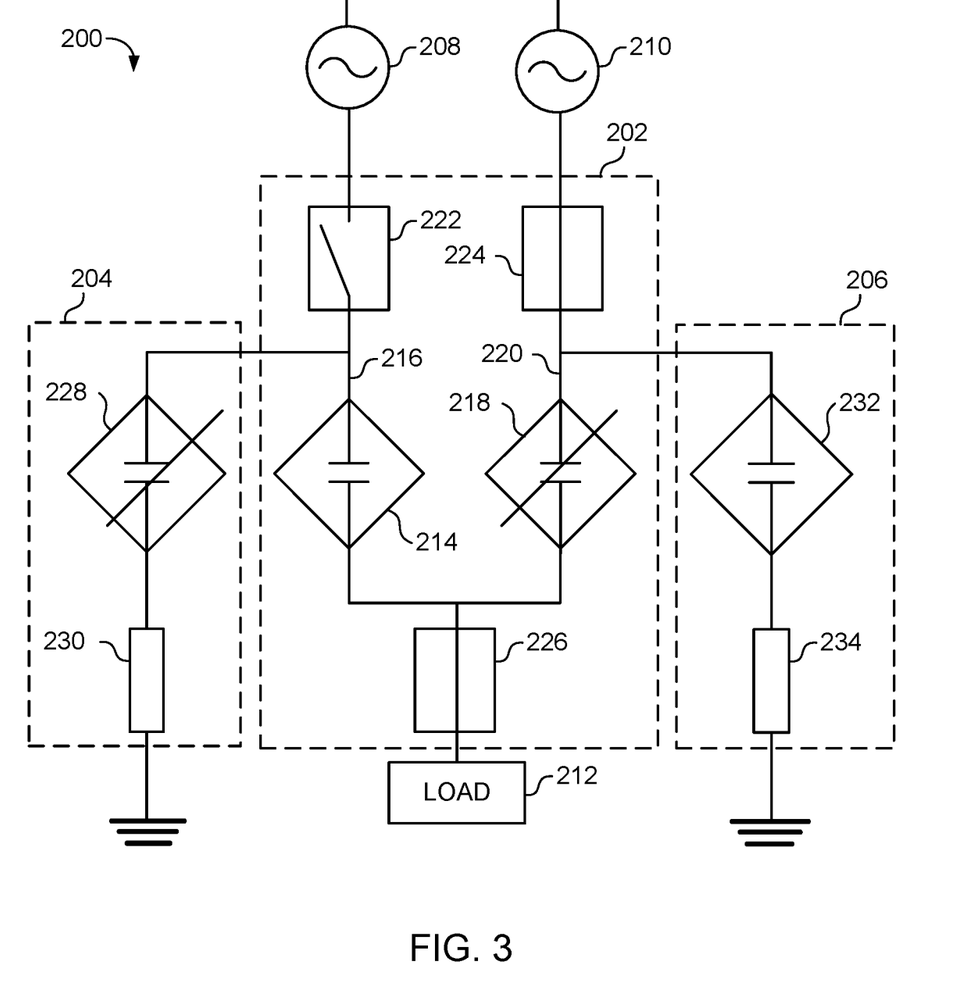
FIG. 3 is a schematic diagram illustrating a system, according to some embodiments.

FIG. 3 is a schematic diagram illustrating a system 200, according to some embodiments.

The system 200 includes transfer switch 202, resistor circuit 204, and resistor circuit 206. The transfer switch 202 is in electrical connection with power source 208 and power source 210, and the transfer switch 202 connects each of the power source 208 and the power source 210 to an electrical load 212, as will be further described herein.

The transfer switch 202 includes switch device 214 at leg 216 and switch device 218 at leg 220. The switch device 214 is located between power source 208 and electrical load 212 at leg 216, and device 218 located between power source 210 and electrical load 212 at leg 220. Switch device 214 switches between a closed state and an open state to connect or disconnect, respectively, power source 208 with electrical load 212. In some embodiments, switch device 214 switches to the closed state to electrically connect power source 208 with electrical load 212 through leg 216. In other embodiments, switch device 214 switches to the open state to electrically disconnect power source 208 from electrical load 212 through leg 216.

In addition, device 218 switches between a closed state and an open state to connect or disconnect, respectively, power source 210 with electrical load 212. In some embodiments, device 218 switches to the closed state to electrically connect power source 210 with electrical load 212 through leg 220. In other embodiments, device 218 switches to the open state to electrically disconnect power source 210 from electrical load 212 through leg 220.

In some embodiments, transfer switch 102 further includes circuit breaker 222, circuit breaker 224, and circuit breaker 226. Circuit breaker 222 is located at leg 216 between power source 208 and switch device 214. Circuit breaker 222 may be switched open to electrically isolate power source 208 from electrical load 212 and switch device 214, and circuit breaker 222 may be switched close to connect power source 208 to transfer switch 102. Circuit breaker 224 is located at leg 220 between power source 210 and device 218. Circuit breaker 224 may be switched open to electrically isolate power source 210 from electrical load 212 and device 218, and circuit breaker 224 may be switched closed to connect power source 210 to transfer switch 102. Circuit breaker 226 is located between electrical load 212 and switch device 214 and switch device 218 of transfer switch 202. The circuit breaker 226 may be switched between open and closed states to electrically isolate electrical load 212 from transfer switch 102 and power source 208 and/or power source 210 in case of an electrical fault.

Resistor circuit 204 includes switch device 228 and pre-load resistor 230. Resistor circuit 204 electrically connects to transfer switch 202 at leg 216. In some embodiments, resistor circuit 204 electrically connects to the leg 216 between power source 208 and switch device 214. In other embodiments, resistor circuit 204 electrically connects to transfer switch 202 at leg 216 between switch device 214 and circuit breaker 222.

Resistor circuit 206 includes switch device 232 and pre-load resistor 234. Resistor circuit 206 electrically connects to transfer switch 202 at leg 220. In some embodiments, resistor circuit 206 electrically connects to leg 220 between power source 210 and device 218. In other embodiments, resistor circuit 206 electrically connects to transfer switch 202 at leg 220 between device 218 and circuit breaker 224.

The switch device 228 and switch device 232 may, in some embodiments, be a similar switch device as switch device 120 in FIG. 1. In addition, in some embodiments, the pre-load resistor 230 and pre-load resistor 234 may be a similar pre-load resistor device as pre-load resistor 122 in FIG. 1.

Each of resistor circuit 204 and resistor circuit 206 are similar to pre-load resistor circuit 104 in FIG. 1. In this regard, for resistor circuit 204, switch device 228 switches to an open state to disconnect resistor circuit 204 from transfer switch 202 based on switch device 214 being in a close state, and switch device 228 switches to a close state to connect resistor circuit 204 to transfer switch 202 in response to the switch device 214 being in an open state. In addition, for resistor circuit 206, switch device 232 switches to an open state to disconnect resistor circuit 206 from transfer switch 202 based on switch device 218 being in a close state, and switch device 232 switches to a close state to connect resistor circuit 206 to transfer switch 202 in response to the switch device 218 being in an open state. As such, the resistor circuit 204 limits or prevents back feed voltage from leakage ground current building up in transfer switch 202 due to switch device 214 being switched to the open state and disconnecting power source 208 from electrical load 212. Furthermore, the resistor circuit 206 also limits or prevents back feed voltage from building up due to ground leakage current in transfer switch 202 due to switch device 218 being switched to the open state and disconnecting power source 210 from electrical load 212. In this regard, both the resistor circuit 204 and resistor circuit 206, when connected to transfer switch 202 by switch device 228 or switch device 232, respectively, limits voltage buildup in transfer switch 202 due to ground leakage current below a threshold limit (e.g., electrical shock hazard threshold).

In some embodiments, instead of being based on the switch position of switch device 214 and switch device 218, the switching operation of switch device 228 and switch device 232, respectively, may be based on the presence of line voltage at the line terminal, or leg 216 and leg 220, respectively. In some embodiments, system 200 may include one or more sensors configured to measure the line voltage at leg 216 and leg 220 to enable determining the presence of line voltage and to control the switching operation of switch device 228 and switch device 232. For example, the line voltage being detected (or below a certain threshold) at leg 216 causes the switch device 228 to close, and the line voltage not being detected (or below a certain threshold) at leg 220 causes the switch device 232 to close. This would allow for coverage for certain failures such as, for example, failure of one of the main transfer switch devices, e.g., switch device 214 and switch device 218.

Referring to FIG. 3, switch device 214 is in the open state and device 218 is in the closed state, the transfer switch 202 thereby electrically connecting power source 210 to electrical load 212 and electrically isolating power source 208 from electrical load 212. In this configuration, with one source conducting and the other source being unavailable, ground leakage current may potentially build up back feed voltage at leg 216 due to switch device 214 being in the open state. Moreover, in FIG. 3, switch device 228 is in the close state to electrically connect resistor circuit 204 to transfer switch 202 and switch device 232 is in the open state to electrically disconnect resistor circuit 206 from transfer switch 202.

By being in the close state when switch device 214 is in the open state, resistor circuit 204 is capable of limiting or preventing back feed voltage from ground leakage current from building up at leg 216, thereby preventing voltage from building up at leg 216 that may pose an electrical shock hazard. In addition, by being in the open state when device 218 is in the close state, resistor circuit 206 improves efficiency of system 200 and transfer switch 202 by not dissipating power from transfer switch 202 when power source 210 is connected to electrical load 212. In some embodiments, disconnecting one of resistor circuit 204 or resistor circuit 206 when switch device 214 or device 218 is in the close state, respectively, improves efficiency of system 200 by approximately 0.3% at low load levels. In other embodiments, disconnecting one of resistor circuit 204 or resistor circuit 206 when switch device 214 or device 218 is in the close state, respectively, improves efficiency of system 200 by a range of 0.1 to 0.3% at low load levels. Furthermore, by selectively connecting resistor circuit 204 or resistor circuit 206 to transfer switch 202 when the switch device 214 or device 218, respectively, is in the open state, each of the resistor circuit 204 or resistor circuit 206 may be utilized to tune an amount of back feed voltage due to leakage current is in transfer switch 202.

Figure 4A:
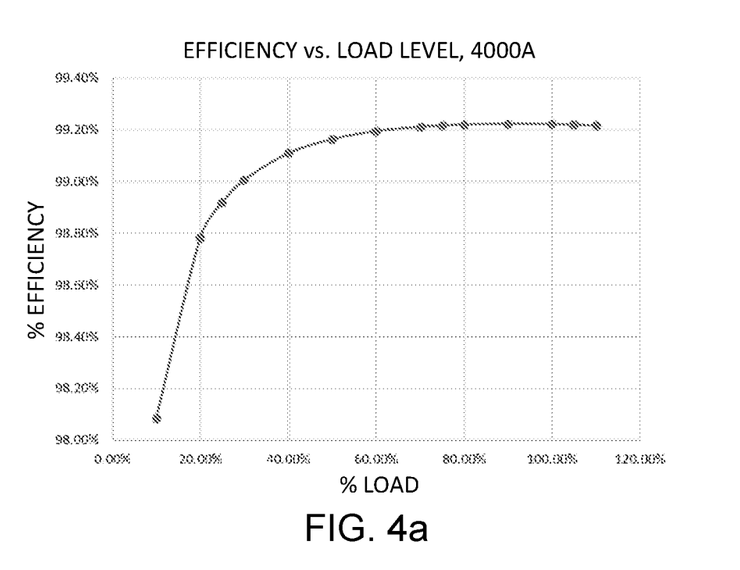
FIG. 4a is a graphical diagram illustrating an efficiency of the system of FIG. 1, according to some embodiments.

FIG. 4a is a graphical diagram illustrating an efficiency of the system 100, according to some embodiments.

The efficiency (%) at different load levels (%) for a transfer switch such as, for example, transfer switch 102 of FIG. 1 is shown in FIG. 4a. Referring to FIG. 4a, the transfer switch includes an active pre-load resistor circuit such as, for example, the pre-load resistor circuit 104 of FIG. 1.

Figure 4B:
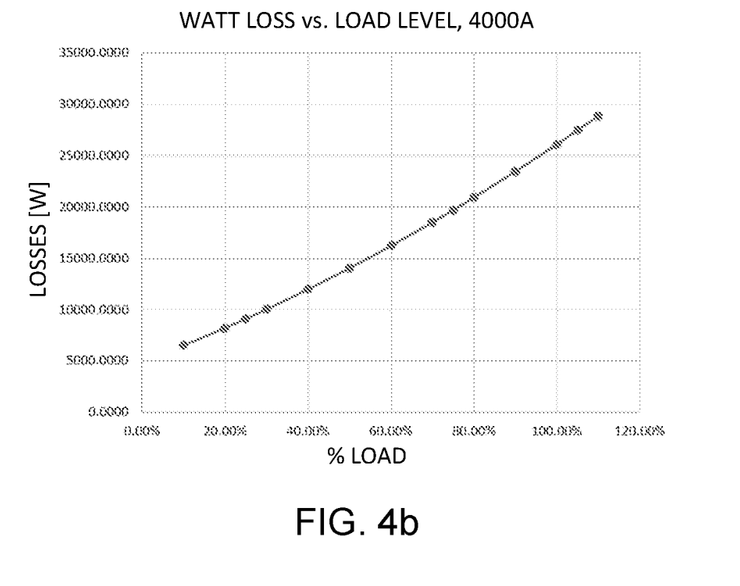
FIG. 4b is a graph diagram illustrating a watt loss of the system of FIG. 1, according to some embodiments.

FIG. 4b is a graph diagram illustrating a watt loss of the system 100, according to some embodiments.

The watt loss (W) at different load levels (%) for a transfer switch such as, for example, transfer switch 102 of FIG. 1 is shown in FIG. 4b. Referring to FIG. 4b, the transfer switch includes an active pre-load resistor circuit such as, for example, the pre-load resistor circuit 104 of FIG. 1.

Referring collectively to FIGS. 4a and 4b, the following table illustrates a non-limiting example of losses and efficiency in a static transfer switch including an active pre-load resistor circuit operating at 480 V in accordance with the present disclosure and as shown in FIGS. 4a and 4b. [Table 1].

| | | | Pthy*6 + 250 W (PS) + 4.66 kW (fans) | | | | |
|---|---|---|---|---|---|---|---|
| Inom ARMS | Load % | IRMS ARMS | ITAV A | Pthy W | Ptotal W | Pload W | Efficiency % |
| 4000.00 | 10.00% | 400.00 | 282.8427 | 264.4280 | 6496.5683 | 332553.76 | 98.08% |
| 4000.00 | 20.00% | 800.00 | 565.6854 | 548.5953 | 8201.5718 | 665107.51 | 98.78% |
| 4000.00 | 25.00% | 1000.00 | 707.1068 | 698.0811 | 9098.4868 | 831384.39 | 98.92% |
| 4000.00 | 30.00% | 1200.00 | 848.5281 | 852.5018 | 10025.0106 | 997661.27 | 99.01% |
| 4000.00 | 40.00% | 1600.00 | 1131.3708 | 1176.1474 | 11966.8846 | 1330215.02 | 99.11% |
| 4000.00 | 50.00% | 2000.00 | 1414.2136 | 1519.5323 | 14027.1939 | 1662768.78 | 99.16% |
| 4000.00 | 60.00% | 2400.00 | 1697.0563 | 1882.6564 | 16205.9384 | 1995322.53 | 99.19% |
| 4000.00 | 70.00% | 2800.00 | 1979.8990 | 2265.5197 | 18503.1182 | 2327876.29 | 99.21% |
| 4000.00 | 75.00% | 3000.00 | 2121.3203 | 2464.3536 | 19696.1213 | 2494153.16 | 99.22% |
| 4000.00 | 80.00% | 3200.00 | 2262.7417 | 2668.1222 | 20918.7333 | 2660430.04 | 99.22% |
| 4000.00 | 90.00% | 3600.00 | 2545.5844 | 3090.4639 | 23452.7836 | 2992983.80 | 99.22% |
| 4000.00 | 100.00% | 4000.00 | 2828.4271 | 3532.5449 | 26105.2691 | 3325537.55 | 99.22% |
| 4000.00 | 105.00% | 4200.00 | 2969.8485 | 3760.9875 | 27475.9251 | 3491814.43 | 99.22% |
| 4000.00 | 110.00% | 4400.00 | 3111.2698 | 3994.3650 | 28876.1899 | 3658091.31 | 99.22% |
| 4000.00 | 115.00% | 4600.00 | 3252.6912 | 4232.6773 | 30306.0635 | 3824368.18 | 99.21% |
| 4000.00 | 120.00% | 4800.00 | 3394.1125 | 4475.9243 | 31765.5460 | 3990645.06 | 99.21% |
| 4000.00 | 125.00% | 5000.00 | 3535.5339 | 4724.1062 | 33254.6372 | 4156921.94 | 99.21% |
| 4000.00 | 150.00% | 6000.00 | 4242.6407 | 6039.0376 | 41144.2257 | 4988306.33 | 99.18% |

It is to be appreciated by those having ordinary skill in the art that Table 1 is exemplary and is not intended to be limiting. As such, the transfer switch may include these or other values based on any of a plurality of factors including, but not limited to, the incoming voltage and current from the electrical power source, the load level, one or more components in the transfer switch, one or more components in the active pre-load resistor, other components, other like factors, or any combinations thereof. Accordingly, the efficiency and watt loss at the transfer switch may vary based on the one or more operating parameters of the system.

Figure 5:
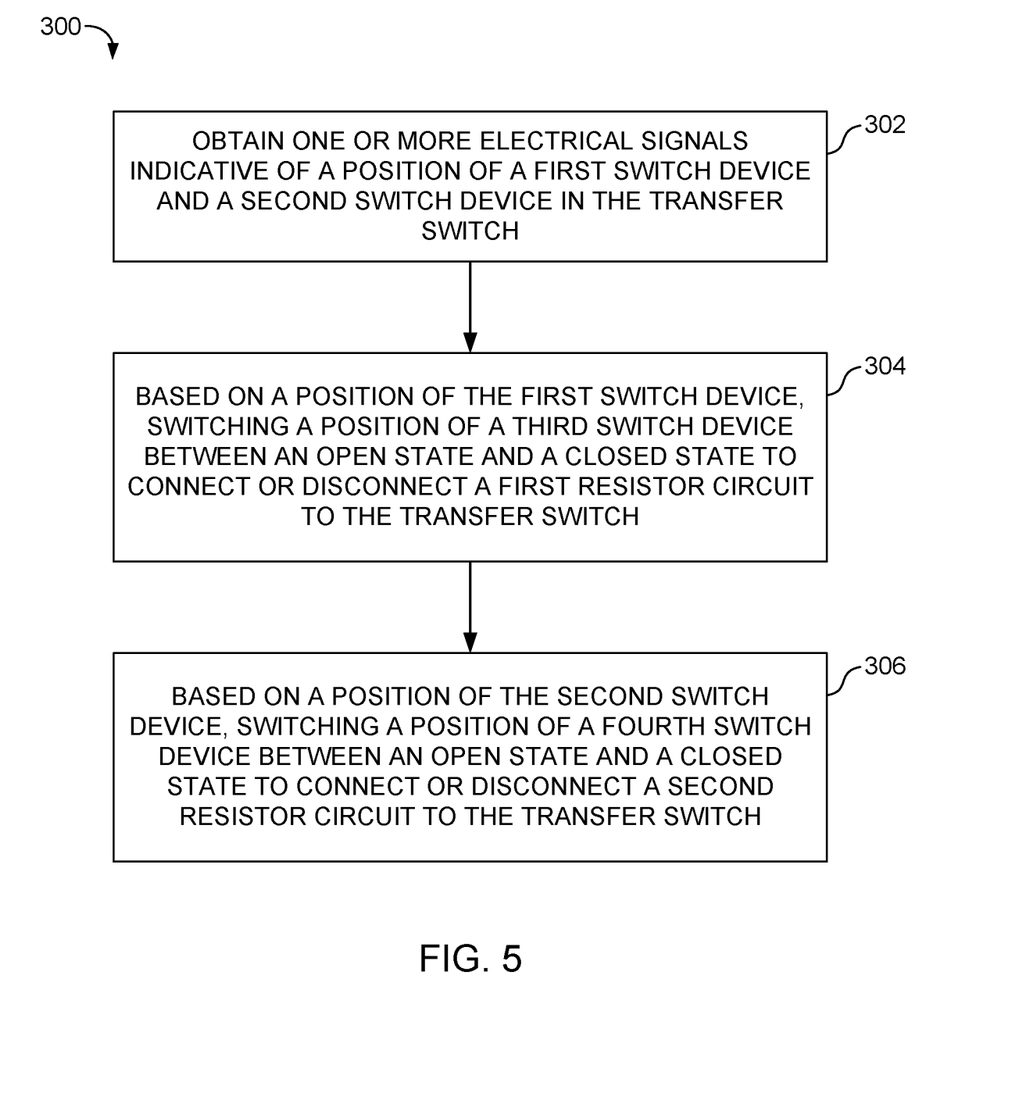
FIG. 5 is a flow diagram of a method, according to some embodiments.

FIG. 5 is a flow diagram of a method 300, according to some embodiments.

At 302, the method 300 includes obtaining one or more electrical signals indicative of a position of switch device 214 and a second switch device 218 in the transfer switch 202. The switch device 214 connects an electrical power source 208 to an electrical load 212 and the switch device 218 connects an electrical power source 210 to the electrical load 212. In transfer switch 202, the switch device 214 and device 218 may be selectively controlled to electrically connect one of power source 208 and power source 210 to electrical load 212 and to electrically disconnect the other of power source 208 and power source 210 to electrical load 212.

In some embodiments, a controller may be in electrical connection with switch device 214 and switch device 218 to control a switching operation of switch device 214 and device 218 to connect power source 208 and power source 210 to electrical load 212 and to disconnect power source 208 and power source 210 from electrical load 212. In other embodiments, switch device 214 and switch device 218 may each include therein a controller for controlling a switching operation of the switch device 214 and switch device 218, respectively. In some embodiments, the transfer switch 202 may include one or more controllers for controlling an operation of one or more components of transfer switch 202 including, but not limited to, switch device switch device 214, switch device 218, circuit breaker 222, circuit breaker 224, circuit breaker 226, other components, or any combinations thereof.

At 304, the method 300 includes based on a position of the switch device 214, switching a position of switch device 228 between an open state and a closed state to connect or disconnect resistor circuit 204 to the transfer switch 202. At 306, the method 300 includes based on a position of the second switch device, switching, by the controller, a position of a fourth switch device between an open state and a closed state to connect or disconnect a second resistor circuit to the transfer switch. Connecting the resistor circuit 204 or the resistor circuit 206 to transfer switch 202 when a respective one of the switch device 214 or switch device 218 is in the open state limits (e.g., prevents) back feed voltage generated as a result of the leakage ground current from building up in transfer switch 202. Moreover, disconnecting the resistor circuit 204 or the resistor circuit 206 when the respective one of the switch device 214 or switch device 218 is in the closed state improves efficiency of the transfer switch by approximately 0.3% at low load levels.

In some embodiments, switching the position of switch device 228 between open and closed states to connect or disconnect the resistor circuit 204 to transfer switch 202 may further include in response to determining switch device 214 is in the open state, switching switch device 228 to the closed state to connect resistor circuit 204 to the transfer switch 202, and in response to determining switch device 214 is in the closed state, switching switch device 228 to the open state to disconnect resistor circuit 204 from the transfer switch 202. In addition, in some embodiments, switching the position of switch device 232 between open and closed states to connect or disconnect the resistor circuit 206 to transfer switch 202 further includes in response to determining switch device 218 is in the open state, switching switch device 232 to the closed state to connect resistor circuit 206 to transfer switch 202 to limit back feed voltage generated as a result of leakage ground current in transfer switch 202, and in response to determining switch device 218 is in the closed state, switching switch device 232 to the open state to disconnect the resistor circuit 206 from transfer switch 202.

In some embodiments, the resistor circuit 204 or the resistor circuit 206, when connected to transfer switch 202 at leg 216 or leg 220, respectively, limits back feed voltage generated from ground leakage current in transfer switch 202 below a threshold limit. The limit being determined to prevent the voltage from posing as an electrical shock hazard at the transfer switch 202 and/or affecting the controller that controls an operation of transfer switch 202. Moreover, in some embodiments, by disconnecting the resistor circuit 204 or resistor circuit 206 when switch device 214 or switch device 218 is closed, the efficiency of transfer switch 202 is improved by a range of 0.1 to 0.3% at low load levels. Moreover, the switch device 228 and switch device 232 may be selectively controlled to switch between the open and close states when the switch device 214 or switch device 218 is open, respectively, such that resistor circuit 204 and resistor circuit 206 may tune an amount of back feed voltage that is built up in transfer switch 202 at the respective leg 216 or leg 220.

In some embodiments, the transfer switch 202 may include circuit breaker 222, circuit breaker 224, circuit breaker 226, other circuit breakers, or any combinations thereof. Each of circuit breaker 222, circuit breaker 224, and circuit breaker 226 may be placed into the open state or closed state to isolate power source 208 and/or power source 210 from electrical load 212. For example, circuit breaker 222 may be placed in the open state when switch device 214 is open to electrically isolate power source 208 from transfer switch 202 and to prevent the back feed voltage generated as a result of leakage current from affecting power source 208. Similarly, circuit breaker 224 may be placed in the open state when switch device 218 is open to electrically isolate power source 210 from transfer switch 202 and to prevent the back feed voltage generated as a result of leakage current from affecting power source 210. Also, circuit breaker 226 may be placed in the open and closed states to electrically disconnect or disconnect the electrical load 212 from transfer switch 202 or from power source 208 and power source 210.

All prior patents and publications referenced herein are incorporated by reference in their entireties.

Throughout the specification and claims, the following terms take the meanings explicitly associated herein, unless the context clearly dictates otherwise. The phrases "in one embodiment," "in an embodiment," and "in some embodiments" as used herein do not necessarily refer to the same embodiment(s), though it may. Furthermore, the phrases "in another embodiment" and "in some other embodiments" as used herein do not necessarily refer to a different embodiment, although it may. All embodiments of the disclosure are intended to be combinable without departing from the scope or spirit of the disclosure.

[ZOT—Definition of Terms—Use as Needed]

As used herein, the term "based on" is not exclusive and allows for being based on additional factors not described, unless the context clearly dictates otherwise. In addition, throughout the specification, the meaning of "a," "an," and "the" include plural references. The meaning of "in" includes "in" and "on."

As used herein, the term "between" does not necessarily require being disposed directly next to other elements. Generally, this term means a configuration where something is sandwiched by two or more other things. At the same time, the term "between" can describe something that is directly next to two opposing things. Accordingly, in any one or more of the embodiments disclosed herein, a particular structural component being disposed between two other structural elements can be:

disposed directly between both of the two other structural elements such that the particular structural component is in direct contact with both of the two other structural elements;

disposed directly next to only one of the two other structural elements such that the particular structural component is in direct contact with only one of the two other structural elements;

disposed indirectly next to only one of the two other structural elements such that the particular structural component is not in direct contact with only one of the two other structural elements, and there is another element which juxtaposes the particular structural component and the one of the two other structural elements;

disposed indirectly between both of the two other structural elements such that the particular structural component is not in direct contact with both of the two other structural elements, and other features can be disposed therebetween; or any combination(s) thereof.

As used herein "embedded" means that a first material is distributed throughout a second material.

Aspects

Various Aspects are described below. It is to be understood that any one or more of the features recited in the following Aspect(s) can be combined with any one or more other Aspect(s).

Aspect 1. A system comprising: a transfer switch comprising: a first switch device located at a first leg between a first power source and an electrical load, and a second switch device located at a second leg between a second power source and the electrical load; and a first resistor circuit connected to the first leg and comprising: a third switch device, wherein the third switch device switches to an open state to disconnect the first resistor circuit from the transfer switch based on the first switch device being in a close state, and the third switch device switches to a close state to connect the first resistor circuit to the transfer switch in response to the first switch device being in an open state; wherein the first resistor circuit limits back feed voltage generated as a result of leakage current in the transfer switch when connected to the transfer switch.

Aspect 2. The system according to aspect 1, further comprising: a second resistor circuit connected to the second leg and comprising: a fourth switch device, wherein the fourth switch device switches to an open state to disconnect the second resistor circuit from the transfer switch based on the second switch device being in a close state, and the fourth switch device switches to the close state to connect the second resistor circuit to the transfer switch in response to the second switch device being in an open state; wherein the second resistor circuit limits back feed voltage generated as a result of leakage current in the transfer switch.

Aspect 3. The system according to aspect 2, wherein the first resistor circuit or the second resistor circuit limits back feed voltage in the transfer switch below a threshold limit, wherein the back feed voltage builds up due to ground leakage current.

Aspect 4. The system according to aspects 2 or 3, wherein disconnecting the first resistor circuit when the first switch device is closed or disconnecting the second resistor circuit when the second switch device is closed improves efficiency at the transfer switch by approximately 0.3% at low load levels.

Aspect 5. The system according to aspects 2, 3, or 4, wherein disconnecting the first resistor circuit or the second resistor circuit improves efficiency of the transfer switch by a range from 0.1 to 0.3% at low load levels.

Aspect 6. The system according to aspects 2, 3, 4, 5, or 6, wherein the first switch device and the second switch device comprise a solid state switch device.

Aspect 7. The system according to aspects 2, 3, 4, 5 or 6, wherein the third switch device and the fourth switch device comprise a solid state switch device, wherein the third switch device and the fourth switch device may further be selectively controlled to connect the first resistor circuit or the second resistor circuit, respectively, to tune an amount of back feed voltage in the transfer switch.

Aspect 8. The system according to aspects 2, 3, 4, 5, 6, or 7, wherein each of the third switch device and fourth switch device further comprises: a controller, wherein the controller detects a position of the first switch device or second switch device, respectively, and controls the third switch device or fourth switch device to switch between the open state and the close state.

Aspect 9. The system according to aspect 8, wherein the controller obtains an electrical signal from one or more switch contacts in the first switch device or second switch device, respectively, indicative of the position of the first switch device or second switch device.

Aspect 10. The system according to aspect 8, wherein the controller detects a presence of a line voltage at the first leg or second leg, respectively, indicative of the position of the first switch device or the second switch device.

Aspect 11. A transfer switch device comprising: a first leg comprising: a first switch device located between a first power source and an electrical load; a second leg comprising: a second switch device located between a second power source and the electrical load; a first resistor circuit comprising: a third switch device, and wherein the first resistor circuit connects to the first leg between the first switch device and the first power source, wherein the third switch device switches to an open state to disconnect the first resistor circuit from the transfer switch device based on the first switch device being in a close state, and the third switch device switches to a close state to connect the first resistor circuit to the transfer switch device in response to the first switch device being in an open state; and a second resistor circuit comprising: a fourth switch device, and wherein the second resistor circuit connects to the second leg between the second switch device and the second power source, wherein the fourth switch device switches to an open state to disconnect the second resistor circuit from the transfer switch device based on the second switch device being in a close state, and the fourth switch device switches to the close state to connect the second resistor circuit to the transfer switch device in response to the second switch device being in an open state; wherein the first resistor circuit limits back feed voltage due to leakage current in the transfer switch device when connected to the transfer switch device.

Aspect 12. The transfer switch device according to aspect 11, wherein the first resistor circuit or the second resistor circuit limits back feed voltage in the transfer switch device below a threshold limit, wherein the back feed voltage builds up due to ground leakage current.

Aspect 13. The transfer switch device according to aspects 11 or 12, wherein disconnecting the first resistor circuit or the second resistor circuit improves efficiency of the transfer switch device by a range from 0.1 to 0.3% at low load levels.

Aspect 14. The transfer switch device according to aspects 11, 12, or 13, wherein the first switch device and the second switch device comprise a solid state switch device, and wherein the third switch device and the fourth switch device comprise a solid state switch device.

Aspect 15. The transfer switch device according to aspects 11, 12, 13, or 14, wherein the third switch device and the fourth switch device may further be selectively controlled to selectively connect the first resistor circuit or the second resistor circuit, respectively, to tune an amount of back feed voltage in the transfer switch device.

Aspect 16. The transfer switch device according to aspects 11, 12, 13, 14, or 15, wherein each of the third switch device and the fourth switch device further comprises: a controller, wherein the controller detects a position of the first switch device or second switch device, respectively, and controls the third switch device or fourth switch device to switch between the open state and the close state.

Aspect 17. The transfer switch device according to aspect 16, wherein the controller obtains an electrical signal from one or more switch contacts in the first switch device or second switch device, respectively, indicative of the position of the first switch device or second switch device.

Aspect 18. A method for limiting a back feed voltage generated as a result of leakage current in a transfer switch comprising: obtaining, by a controller, one or more electrical signals indicative of a position of a first switch device and a second switch device in the transfer switch, wherein the first switch device connects a first electrical power source to an electrical load and the second switch device connects a second electrical power source to the electrical load, based on a position of the first switch device, switching, by the controller, a position of a third switch device between an open state and a closed state to connect or disconnect a first resistor circuit to the transfer switch; based on a position of the second switch device, switching, by the controller, a position of a fourth switch device between an open state and a closed state to connect or disconnect a second resistor circuit to the transfer switch; and wherein connecting the first resistor circuit or the second resistor circuit when a respective one of the first switch device or second switch device is in the open state limits the back feed voltage in the transfer switch; wherein disconnecting the first resistor circuit or the second resistor circuit when the respective one of the first switch device or second switch device is in the closed state improves efficiency of the transfer switch by approximately 0.3% at low load level.

Aspect 19. The method according to aspect 18, wherein switching the position of the third switch device between open and closed states to connect or disconnect the first resistor circuit to the transfer switch further comprises: in response to determining the first switch device is in the open state, switching, by a first controller, the third switch device to the closed state to connect the first resistor circuit to the transfer switch, and in response to determining the first switch device is in the closed state, switching, by the first controller, the third switch device to the open state to disconnect the first resistor circuit from the transfer switch.

Aspect 20. The method according to aspects 18 or 19, wherein switching the position of the fourth switch device between open and closed states to connect or disconnect the second resistor circuit to the transfer switch further comprises: in response to determining the second switch device is in the open state, switching, by a second controller, the fourth switch device to the closed state to connect the second resistor circuit to the transfer switch to limit back feed voltage generated as a result of leakage current in the transfer switch, and in response to determining the second switch device is in the closed state, switching, by the second controller, the fourth switch device to the open state to disconnect the second resistor circuit from the transfer switch.

It is to be understood that changes may be made in detail, especially in matters of the construction materials employed and the shape, size, and arrangement of parts without departing from the scope of the present disclosure. This Specification and the embodiments described are examples, with the true scope and spirit of the disclosure being indicated by the claims that follow.

What is claimed is:

1. A system comprising:
    a transfer switch comprising:
        a first switch device located at a first leg between a first power source and an electrical load to connect the first power source to the electrical load, and
        a second switch device located at a second leg between a second power source and the electrical load to connect the second power source to the electrical load; and
    a first resistor circuit connected to the first leg and comprising:
        a third switch device,
            wherein the third switch device switches to an open state to disconnect the first resistor circuit from the transfer switch based on the first switch device being in a close state, and the third switch device switches to a close state to connect the first resistor circuit to the transfer switch in response to the first switch device being in an open state;
    wherein the first resistor circuit limits back feed voltage generated as a result of leakage current in the transfer switch when connected to the transfer switch.

2. The system according to claim 1, further comprising:
    a second resistor circuit connected to the second leg and comprising:
        a fourth switch device,
            wherein the fourth switch device switches to an open state to disconnect the second resistor circuit from the transfer switch based on the second switch device being in a close state, and the fourth switch device switches to the close state to connect the second resistor circuit to the transfer switch in response to the second switch device being in an open state;
    wherein the second resistor circuit limits back feed voltage generated as a result of leakage current in the transfer switch.

3. The system according to claim 2, wherein the first resistor circuit or the second resistor circuit limits back feed voltage in the transfer switch below a threshold limit, wherein the back feed voltage builds up due to leakage current.

4. The system according to claim 3, wherein disconnecting the first resistor circuit when the first switch device is closed or disconnecting the second resistor circuit when the second switch device is closed improves efficiency at the transfer switch by approximately 0.3% at low load levels.

5. The system according to claim 4, wherein disconnecting the first resistor circuit or the second resistor circuit improves efficiency of the transfer switch by a range from 0.1 to 0.3% at low load levels.

6. The system according to claim 2, wherein the first switch device and the second switch device comprise a solid state switch device, wherein the third switch device and the fourth switch device comprise a solid state switch device.

7. The system according to claim 2, wherein the third switch device and the fourth switch device may further be selectively controlled to connect the first resistor circuit or the second resistor circuit, respectively, to tune an amount of back feed voltage in the transfer switch.

8. The system according to claim 2, wherein each of the third switch device and fourth switch device further comprises:
a controller,
wherein the controller detects a position of the first switch device or second switch device, respectively, and controls the third switch device or fourth switch device to switch between the open state and the close state.

9. The system according to claim 8, wherein the controller obtains an electrical signal from one or more switch contacts in the first switch device or second switch device, respectively, indicative of the position of the first switch device or the second switch device.

10. The system according to claim 8, wherein the controller detects a presence of a line voltage at the first leg or second leg, respectively, indicative of the position of the first switch device or the second switch device.

11. A transfer switch device comprising:
a first leg comprising:
a first switch device located between a first power source and an electrical load to connect the first power source to the electrical load;
a second leg comprising:
a second switch device located between a second power source and the electrical load to connect the second power source to the electrical load;
a first resistor circuit comprising:
a third switch device, and
wherein the first resistor circuit connects to the first leg between the first switch device and the first power source,
wherein the third switch device switches to an open state to disconnect the first resistor circuit from the transfer switch device based on the first switch device being in a close state, and the third switch device switches to a close state to connect the first resistor circuit to the transfer switch device in response to the first switch device being in an open state; and
a second resistor circuit comprising:
a fourth switch device, and
wherein the second resistor circuit connects to the second leg between the second switch device and the second power source,
wherein the fourth switch device switches to an open state to disconnect the second resistor circuit from the transfer switch device based on the second switch device being in a close state, and the fourth switch device switches to the close state to connect the second resistor circuit to the transfer switch device in response to the second switch device being in an open state;
wherein the first resistor circuit limits back feed voltage due to leakage current in the transfer switch device when connected to the transfer switch device.

12. The transfer switch device according to claim 11, wherein the first resistor circuit or the second resistor circuit limits back feed voltage in the transfer switch device below a threshold limit, wherein the back feed voltage builds up due to leakage current.

13. The transfer switch device according to claim 12, wherein disconnecting the first resistor circuit or the second resistor circuit improves efficiency of the transfer switch device by a range from 0.1 to 0.3% at low load levels.

14. The transfer switch device according to claim 11, wherein the first switch device and the second switch device comprise a solid state switch device, and
wherein the third switch device and the fourth switch device comprise a solid state switch device.

15. The transfer switch device according to claim 11, wherein the third switch device and the fourth switch device may further be selectively controlled to selectively connect the first resistor circuit or the second resistor circuit, respectively, to tune an amount of back feed voltage in the transfer switch device.

16. The transfer switch device according to claim 11, wherein each of the third switch device and the fourth switch device further comprises:
a controller,
wherein the controller detects a position of the first switch device or second switch device, respectively, and controls the third switch device or fourth switch device to switch between the open state and the close state.

17. The transfer switch device according to claim 16, wherein the controller obtains an electrical signal from one or more switch contacts in the first switch device or second switch device, respectively, indicative of the position of the first switch device or second switch device.

18. A method for limiting a back feed voltage generated as a result of leakage current in a transfer switch comprising:
obtaining, by a controller, one or more electrical signals indicative of a position of a first switch device and a second switch device in the transfer switch, wherein the first switch device connects a first electrical power source to an electrical load and the second switch device connects a second electrical power source to the electrical load,
based on a position of the first switch device, switching, by the controller, a position of a third switch device between an open state and a closed state to connect or disconnect a first resistor circuit to the transfer switch;
based on a position of the second switch device, switching, by the controller, a position of a fourth switch device between an open state and a closed state to connect or disconnect a second resistor circuit to the transfer switch; and
wherein connecting the first resistor circuit or the second resistor circuit when a respective one of the first switch device or second switch device is in the open state limits the back feed voltage in the transfer switch;
wherein disconnecting the first resistor circuit or the second resistor circuit when the respective one of the first switch device or second switch device is in the closed state improves efficiency of the transfer switch by approximately 0.3% at low load level.

19. The method according to claim 18, wherein switching the position of the third switch device between open and closed states to connect or disconnect the first resistor circuit to the transfer switch further comprises:
- in response to determining the first switch device is in the open state, switching, by a first controller, the third switch device to the closed state to connect the first resistor circuit to the transfer switch, and
- in response to determining the first switch device is in the closed state, switching, by the first controller, the third switch device to the open state to disconnect the first resistor circuit from the transfer switch.

20. The method according to claim 19, wherein switching the position of the fourth switch device between open and closed states to connect or disconnect the second resistor circuit to the transfer switch further comprises:
- in response to determining the second switch device is in the open state, switching, by a second controller, the fourth switch device to the closed state to connect the second resistor circuit to the transfer switch to limit back feed voltage generated as a result of leakage current in the transfer switch, and
- in response to determining the second switch device is in the closed state, switching, by the second controller, the fourth switch device to the open state to disconnect the second resistor circuit from the transfer switch.

* * * * *